United States Patent
Lin et al.

(10) Patent No.: US 8,563,198 B2
(45) Date of Patent: Oct. 22, 2013

(54) DEVICE AND METHOD FOR PROVIDING WAVELENGTH REDUCTION WITH A PHOTOMASK

(75) Inventors: Burn Jeng Lin, Hsin-Chu (TW); Jeng Horng Chen, Hsin-Chu (TW); Chun-Kuang Chen, Hsin-Chu Hsien (TW); Tsai-Sheng Gau, Hsin-Chu (TW); Ru-Gun Liu, Zhubei (TW); Jen-Chieh Shih, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 34 days.

(21) Appl. No.: 13/160,231

(22) Filed: Jun. 14, 2011

(65) Prior Publication Data
US 2011/0244378 A1 Oct. 6, 2011

Related U.S. Application Data

(63) Continuation of application No. 10/964,842, filed on Oct. 13, 2004, now abandoned.

(60) Provisional application No. 60/511,503, filed on Oct. 15, 2003.

(51) Int. Cl.
G03F 1/46 (2012.01)
G03F 1/48 (2012.01)

(52) U.S. Cl.
USPC .................................................. 430/5

(58) Field of Classification Search
USPC .................................................. 430/5
See application file for complete search history.

(56) References Cited

U.S. PATENT DOCUMENTS

| | | | |
|---|---|---|---|
| 3,676,002 A | 7/1972 | Moreau et al. | |
| 4,363,846 A | 12/1982 | Kaneki | |
| 4,537,813 A | 8/1985 | Kuyel | |
| 5,424,153 A | 6/1995 | Asai | |
| 5,795,684 A | 8/1998 | Troccolo | |
| 5,935,733 A | 8/1999 | Scott et al. | |
| 6,027,815 A * | 2/2000 | Hsu | 430/5 |
| 6,576,375 B1 | 6/2003 | Miyoshi et al. | |
| 6,617,265 B2 | 9/2003 | Ttanaka et al. | |

OTHER PUBLICATIONS

Chinese Patent Office, Office Action dated Jul. 31, 2009, Application No. 2005101130380, 8 pages.

* cited by examiner

*Primary Examiner* — Mark F Huff
*Assistant Examiner* — John S Ruggles
(74) *Attorney, Agent, or Firm* — Haynes and Boone, LLP

(57) ABSTRACT

Disclosed is a photomask having a wavelength-reducing material that may be used during photolithographic processing. In one example, the photomask includes a transparent substrate, an absorption layer having at least one opening, and a layer of wavelength-reducing material (WRM) placed into the opening. The thickness of the WRM may range from approximately a thickness of the absorption layer to approximately ten times the wavelength of light used during the photolithographic processing. In another example, the photomask includes at least one antireflection coating (ARC) layer.

21 Claims, 15 Drawing Sheets

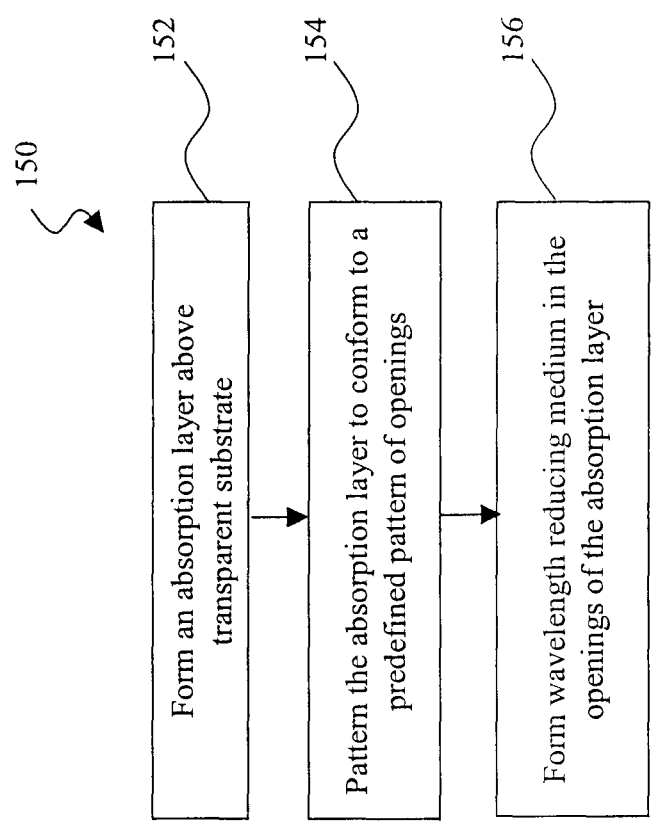

DEVICE AND METHOD FOR PROVIDING WAVELENGTH REDUCTION WITH A PHOTOMASK

This application is a continuation of U.S. patent application Ser. No. 10/964,842, filed on Oct. 13, 2004 and entitled "Device and Method for Providing Wavelength Reduction with a Photomask," which claims benefit and priority from U.S. Provisional Patent Application Ser. No. 60/511,503, filed on Oct. 15, 2003 and entitled "Device and Method for Providing Wavelength Reduction with a Photomask," each of which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing have been needed.

For example, in the course of integrated circuit evolution, functional density (i.e., the number of interconnected devices per chip area) has generally increased while feature size (i.e., the smallest component or line that can be created using a fabrication process) has decreased. This scaling down process generally provides benefits by increasing production efficiency and lowering associated costs, but needs to be matched by improvements in the fabrication process. For instance, many fabrication processes utilize a photomask to form a pattern during photolithography. The pattern may contain a pattern of designed circuits that will be transferred onto a semiconductor wafer. However, because of the increasingly small patterns that are to be used during photolithography, photomasks have generally needed increasingly high resolutions.

SUMMARY

In one embodiment, the present disclosure provides a photomask for forming a pattern during photolithography when illuminated with a predetermined wavelength of light. The photomask comprises a transparent substrate; an absorption layer proximate to the substrate, wherein the absorption layer has at least one opening formed therein; and a layer of wavelength-reducing material disposed in at least one opening, wherein a thickness of the wavelength-reducing material and the absorption layer form a generally planar surface.

BRIEF DESCRIPTION OF THE DRAWINGS

FIG. 2 is a flow chart of an exemplary method for forming the photomask of FIG. 1.

DETAILED DESCRIPTION

Figure 1:
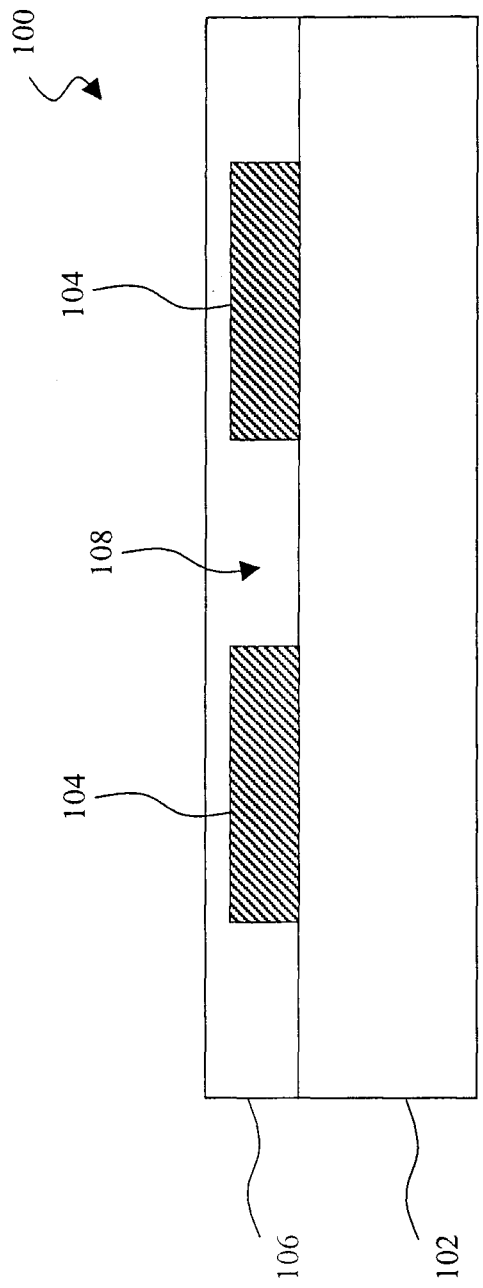
FIG. 1 illustrates a cross-sectional view of one embodiment of a photomask with a wavelength reducing medium.

The present disclosure relates generally to photolithography and, more particularly, to using a wave-length reducing medium with a photomask. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, a cross-sectional view of one embodiment of a photomask 100 is illustrated. The photomask 100 comprises a transparent substrate 102, an absorption layer 104, and a wavelength-reducing material (WRM) 106. The transparent substrate 102 may use fused silica (SiO2) or a glass relatively free of defects, such as borosilicate glass and soda-lime glass. Other suitable materials may also be used.

The absorption layer 104 may be formed using a number of different processes and materials, such as depositing of a metal film made with Chromium (Cr) oxide and iron oxide, or an inorganic film made with MoSi, ZrSiO, and SiN. The absorption layer 104 may be patterned to have one or more openings 108 through which light may travel without being absorbed by the absorption layer. In some embodiments, the absorption layer 104 may have a multi-layer structure, which may further include an antireflection (ARC) layer and/or other layers. In addition, some of these layers may be formed multiple times to achieve a desired composition of the absorption layer 104.

The absorption layer 104 may be tuned to achieve a predetermined transmittance and an amount of phase shifting, enabling the absorption layer 104 to shift the phase of light passing through the absorption layer, for improved imaging resolution. For example, the transmittance of the absorption layer 104 may be tuned to between approximately three percent and thirty percent, while the phase shift is tuned to approximately 180 degrees. This type of photomask is sometimes referred to as an attenuated phase-shifting photomask. In another example, the transmittance of the absorption layer 104 may be extremely high (e.g., 95%), and the phase shift may be approximately 180 degrees. This type of photomask is sometimes referred to as a chromeless phase-shifting photomask.

The WRM 106 may be used to fill in the one or more openings 108 of the absorption layer 104. The surface of the WRM 106 may be substantially co-planar with the surface of the absorption layer 104, but may be fine tuned to be slightly higher or lower with the plane of the surface of the absorption layer 104. Both materials may be planarized using known planarization techniques, such as chemical-mechanical planarization (CMP) to form a planar surface. The thickness of the WRM 106 may vary from less than to about the thickness of the absorption layer 104 (e.g., if the surface of the WRM is aligned with the surface of the absorber), to up to about ten times the wavelength of light passing through the WRM 106 during photolithographic processing. The WRM material used for the WRM 106 may be chosen based on a desired level of transparency and a desired refractive index. The WRM 106 preferably has a refractive index different from that of the absorption layer. In the present example, the WRM material is selected to provide both a high level of transparency and a high refractive index. Exemplary WRM materials include photoresist materials, polymer materials, and dielectric materials. For example, the material may include polyimide, SiO2, indium tin oxide (ITO), polyvinyl alcohol (PVA), or silicone.

During a photolithography process, the photomask 100 is disposed above a semiconductor formation. Typically, the photomask 100 does not come into contact with the surface of the semiconductor formation. Due to the relatively high refractive index ("n") of the WRM 106, the wavelength of the light passing through the WRM 106 during photolithography processing may be reduced by a factor of n from the wavelength of the light in a vacuum. Since the physical size of the opening 108 in the absorption layer 104 remains the same, but the size of the opening 108 relative to the wavelength of the light is enlarged by the factor of n, optical diffraction is reduced accordingly and the resolution of imaging of the photomask 100 on a wafer may be enhanced.

Figure 3A:
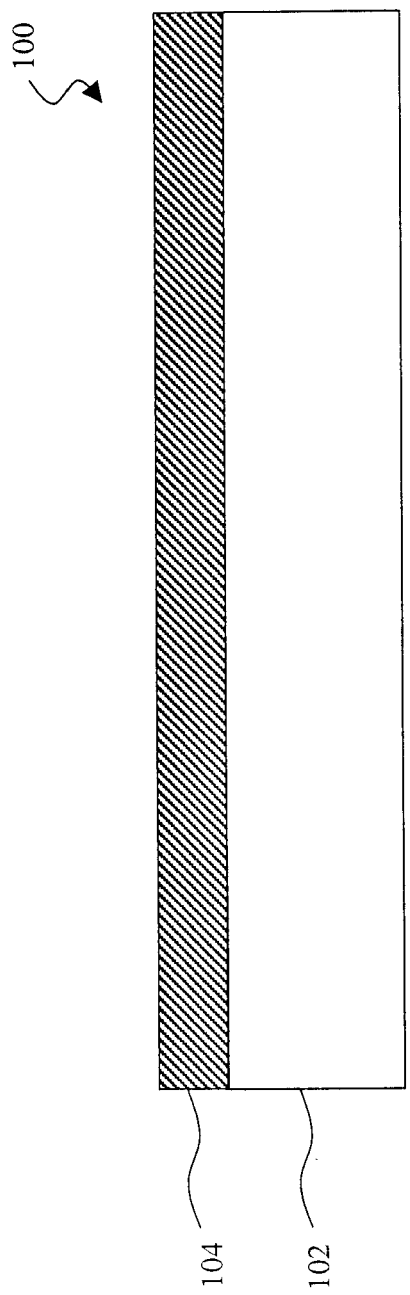
FIGS. 3a-3c illustrate various fabrication stages of the photomask of FIG. 1 as it is formed using the method of FIG. 2.
Figure 3B:
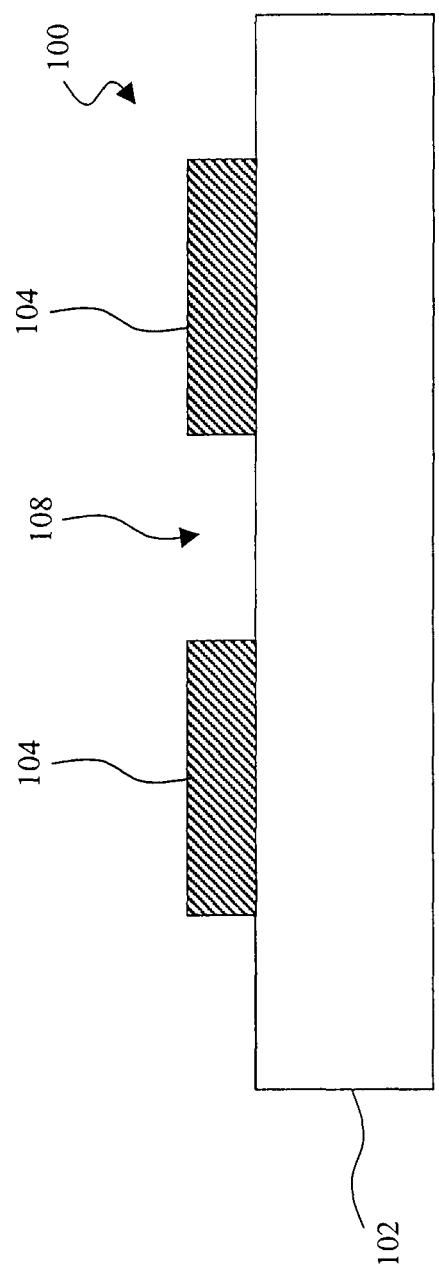
Figure 3C:
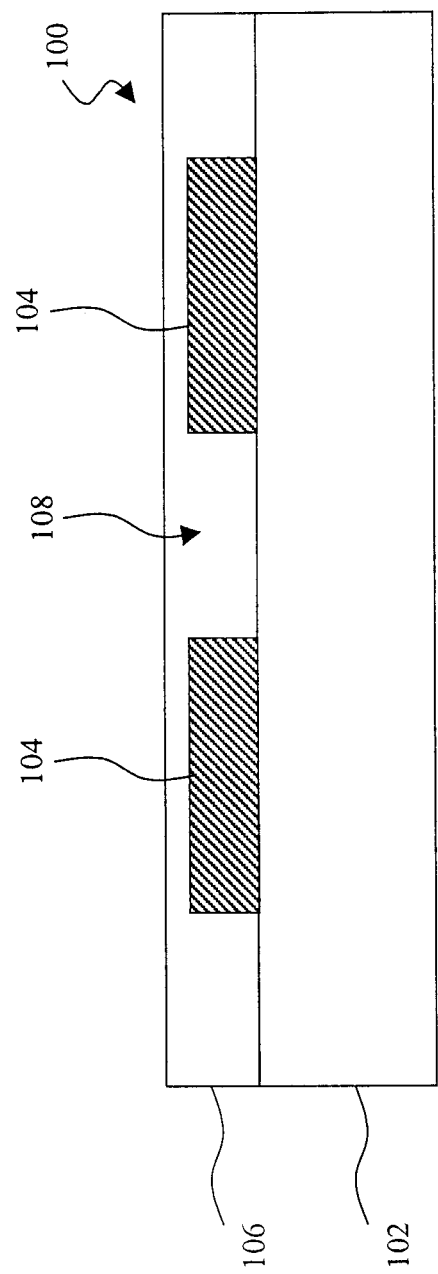

Referring now to FIG. 2 and with additional reference to FIGS. 3a-3c, an exemplary method 150 may be used to form the photomask 100 of FIG. 1. The method 150 begins in step 152 with the formation of the absorption layer 104 above the transparent substrate 102 as shown in FIG. 3a. It is understood that the transparent substrate 102 may be cleaned or otherwise prepared using processes not illustrated in the present example of method 100. The absorption layer 104 may be formed using a process such as a physical vapor deposition (PVD) process, including evaporation and sputtering, a plating process, including electroless plating or electroplating, or a chemical vapor deposition (CVD) process, including atmospheric pressure CVD (APCVD), low pressure CVD (LPCVD), plasma enhanced CVD (PECVD), or high density plasma CVD (HDP CVD). In the present example, a sputtering deposition may be used to provide the absorption layer 104 with thickness uniformity, relatively few defects, and a desired level of adhesion. As previously described with respect to FIG. 1, the absorption layer 104 may include materials such as Chromium oxide, iron oxide, MoSi, ZrSiO, and SiN.

In step 154 (FIG. 3b), the absorption layer 104 may be patterned to have a predefined arrangement of openings 108 using known processes such as a photolithography process or an electron beam process. For example, the photolithography process may include the following processing steps. A photoresist layer (not shown) may undergo a process involving spin-on coating, baking, exposure to illuminated light through a photomask, developing, and post baking. This transfers the pattern from the photomask to the photoresist. Next, a wet etching or dry etching may be used to etch an exposed region of the absorption layer 104 to transfer the pattern from the photoresist to the absorption layer. The photoresist may then be stripped by wet stripping or plasma ashing. In the present example, the patterned absorption layer has at least one opening, as shown in FIG. 3b.

In step 156 and with additional reference to FIG. 3c, the WRM 106 may be formed in the opening of the absorption layer 104 using a process such as a spin-on coating, CVD, atomic layer deposition, or PVD. Depending on a desired thickness of the WRM or upon a desired height of the WRM relative to the surface of the absorption layer 104, the surface of the WRM is substantially co-planar with the absorption layer, but may be fine-tuned to be slightly higher or lower than the surface of the absorption layer 104. A planarizing process, such as CMP may be used to planarize the WRM 106 and the absorption layer 104. In the present example, the thickness of the WRM ranges from about the thickness of the absorption layer 104 to approximately ten times the wavelength of light passing through the WRM during photolithography processing. The WRM may use a material of high transparency and high refractive index, including photoresist materials, polymer materials, and dielectric materials. Examples of WRM materials include polyimide, SiO2, ITO, PVA, and silicone.

Figure 4:
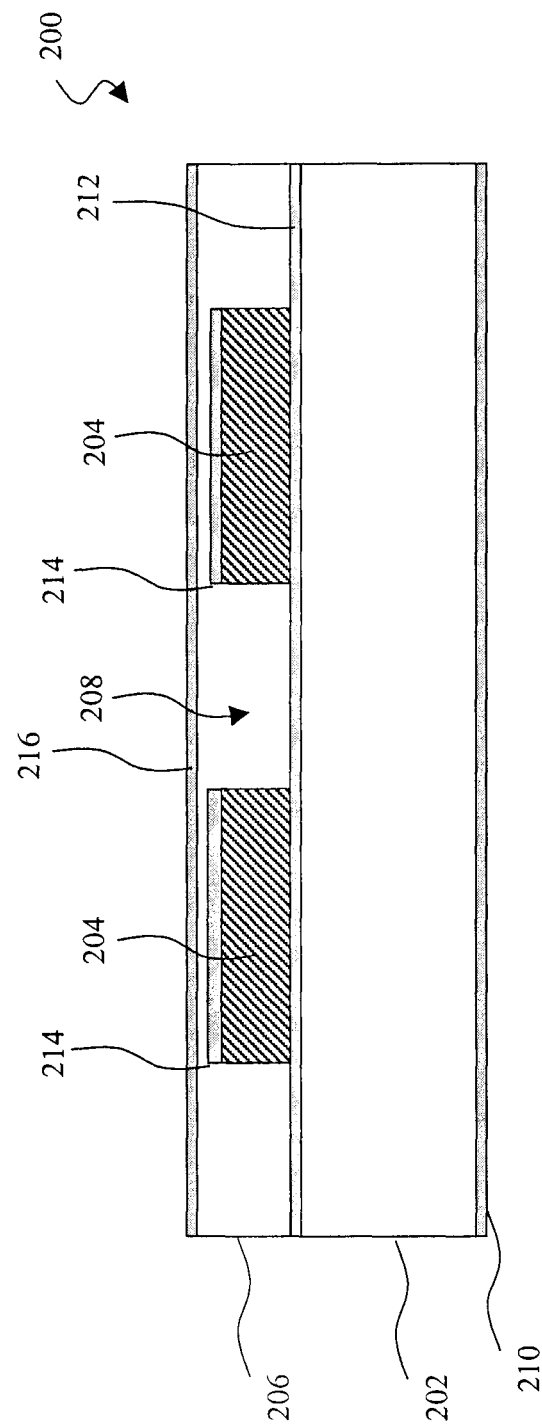
FIG. 4 illustrates a cross-sectional view of another embodiment of a photomask with a wavelength reducing medium.

Referring now to FIG. 4, a cross-sectional view of another embodiment of a photomask 200 is illustrated. The photomask 200 comprises a transparent substrate 202, an absorption layer 204, a WRM 206, and a plurality of antireflection coating (ARC) layers. As the transparent substrate 202, absorption layer 204, and WRM 206 are similar to those described with respect to FIG. 1, they will not be described in detail in the present example.

For purposes of illustration, the ARC layers may include an ARC layer 210 on an underside (relative to the absorption layer 204) of the substrate 202, an ARC layer 212 between the substrate 202 and the absorption layer 204, an ARC layer 214 between the absorption layer 204 and the WRM 206, and/or an ARC layer 216 above the WRM 206. It is understood that the ARC layer 214 may not cover the sidewall of the patterned absorption layer 204, depending on a particular processing sequence or processing method used to form the photomask 100.

The ARC layers 210, 212, 214, 216 may be used at an interface to reduce stray light introduced by the photomask. Such interfaces may include an interface between the substrate 202 and the absorption layer 204 (using the ARC layer 212), an interface between the absorption layer 204 and the WRM 206 (using the ARC layer 214), and an interface between the substrate 202 and the WRM 206 (using the ARC layer 212), even though these ARC layers may function differently. For example, the ARC layer 214 on the absorption layer 204 may eliminate stray light contributed by the high reflectivity of the absorption layer. The ARC layer 216 on the WRM 206 may reduce multiple reflections between the outer face of the WRM 206 and the absorption layer 204. It may also reduce the reflection between the WRM 206 and the space outside. The ARC layer 212 on the substrate may reduce flare back into an illumination system used during photolithography and may provide a smooth transition between the substrate 202 and the WRM 206 to eliminate mismatch of the refractive index.

Each ARC layer may have multi-level structure that provides each ARC layer with multiple layers having different refractive indices. For example, the ARC layers may have a graded structure where the refractive index of each ARC layer changes gradually to match the refractive indexes of neighboring materials in the photomask 100. The ARC layers may comprise an organic material containing hydrogen, carbon, or oxygen; compound materials such as Cr2O3, ITO, SiO2, SiN, TaO5, Al2O3, TiN, and ZrO; metal materials such as Al, Ag, Au, and In; or combination thereof.

Figure 5:
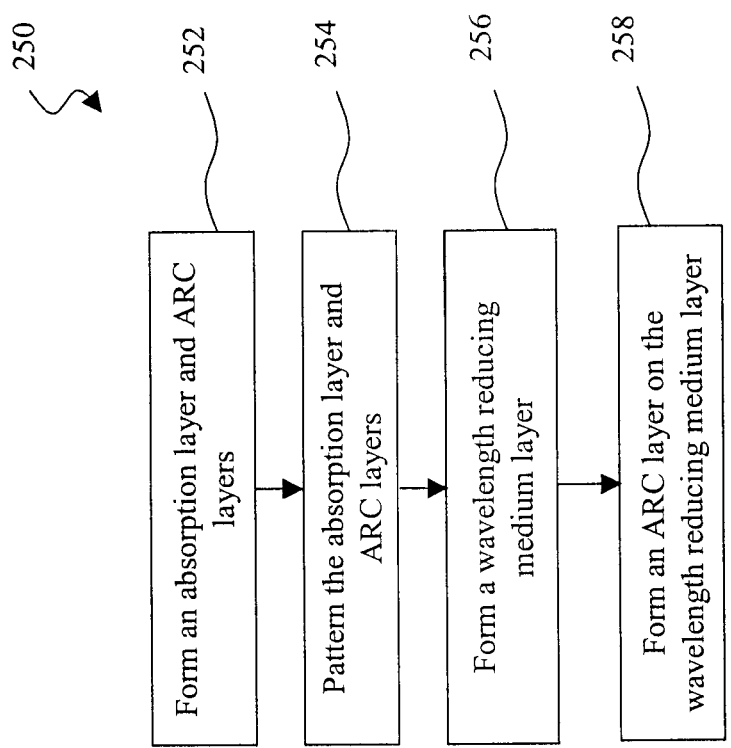
FIG. 5 is a flow chart of an exemplary method for forming the photomask of FIG. 4.
Figure 6A:
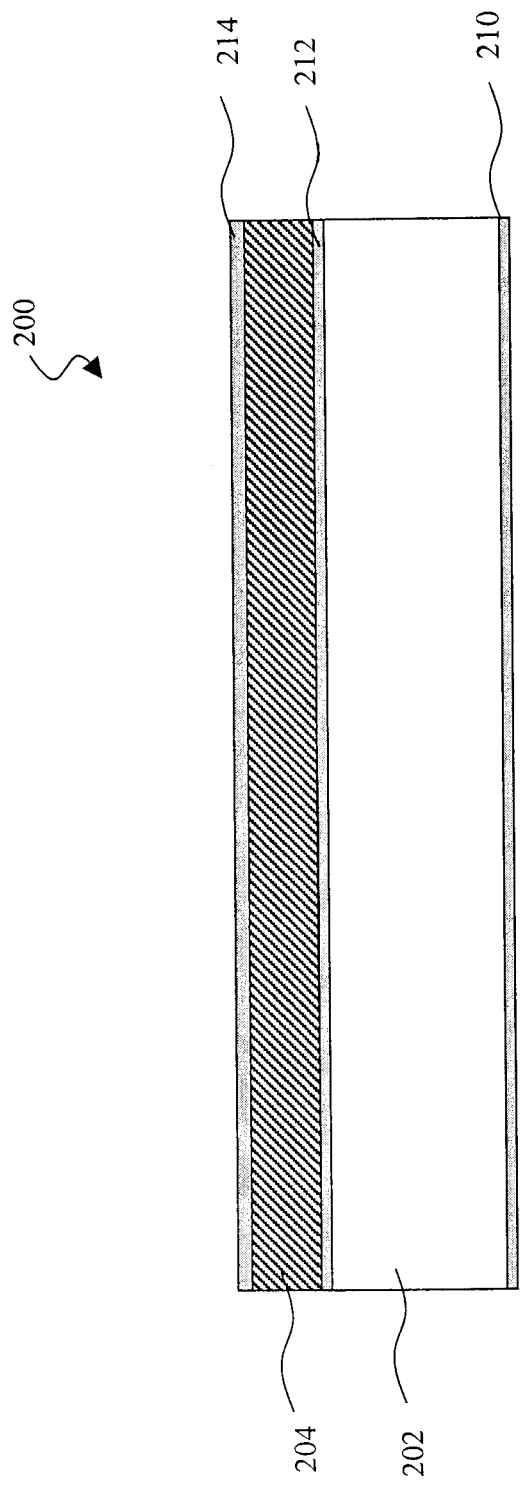
FIGS. 6a-6c illustrate various fabrication stages of the photomask of FIG. 4 as it is formed using the method of FIG. 5.
Figure 6B:
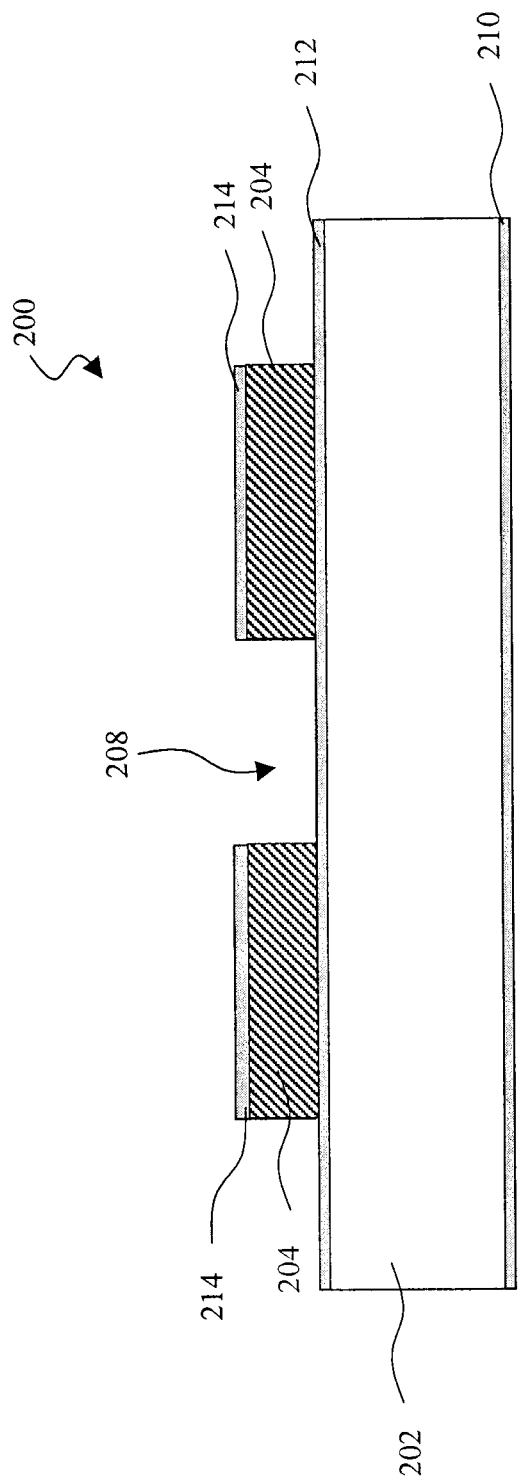
Figure 6C:
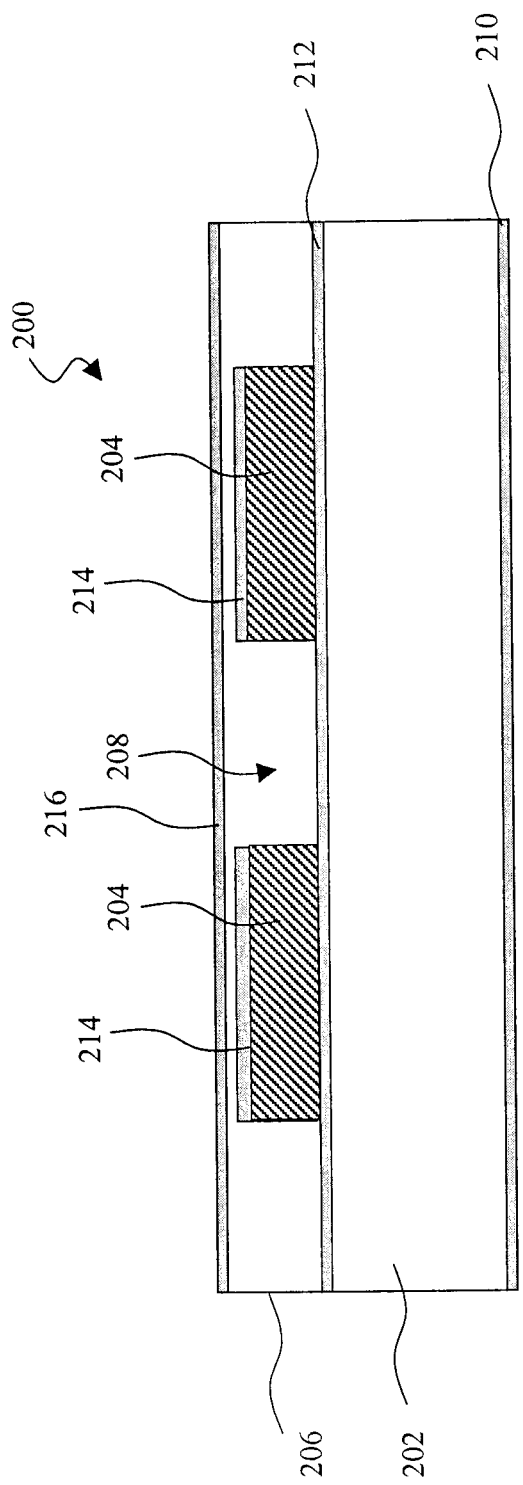

Referring now to FIG. 5 and with additional reference to FIGS. 6a-6c, an exemplary method 250 may be used to form the photomask 200 of FIG. 4. The method 250 begins in step 252 with the formation of the ARC layer 210 on the substrate 202, the formation of the ARC layer 212 on the other side of the substrate 202, the formation of the absorption layer 204, and the formation of the ARC layer 214 above the absorption layer 204.

As previously described, materials used for the absorption layer 204 may include metal film such as Chromium (Cr) oxide and iron oxide, or inorganic films such as MoSi, ZrSiO, and SiN. The absorption layer 204 may be formed using CVD, plating, or PVD processes. In the present example, sputtering deposition may be preferred to provide the absorption layer 204 with thickness uniformity, relatively few defects, and better adhesion.

The ARC layers may use an organic material containing hydrogen, carbon, or oxygen; compound materials including Cr2O3, ITO, SiO2, SiN, TaO5, Al2O3, TiN, and ZrO; metal materials such as Al, Ag, Au, and In; or combination thereof. Methods used to form the ARC layers include spin-on coating, CVD, plating, or PVD.

In step 254, the absorption layer 204 and the ARC layer 214 may be patterned to have a predefined arrangement of openings as previously described with respect to the method 150 of FIG. 2. The ARC layer 214 may be patterned using a processing sequence similar to that used for the absorption layer 204, but may use a different etchant. It is noted that the ARC layer 214 does not cover the sidewalls of the absorption layer 204 (e.g., the walls of the openings 208). In step 256, the WRM 206 may be formed and, in step 258, the ARC layer 216 may be formed using similar materials and processing methods as those used in step 252.

Figure 7:
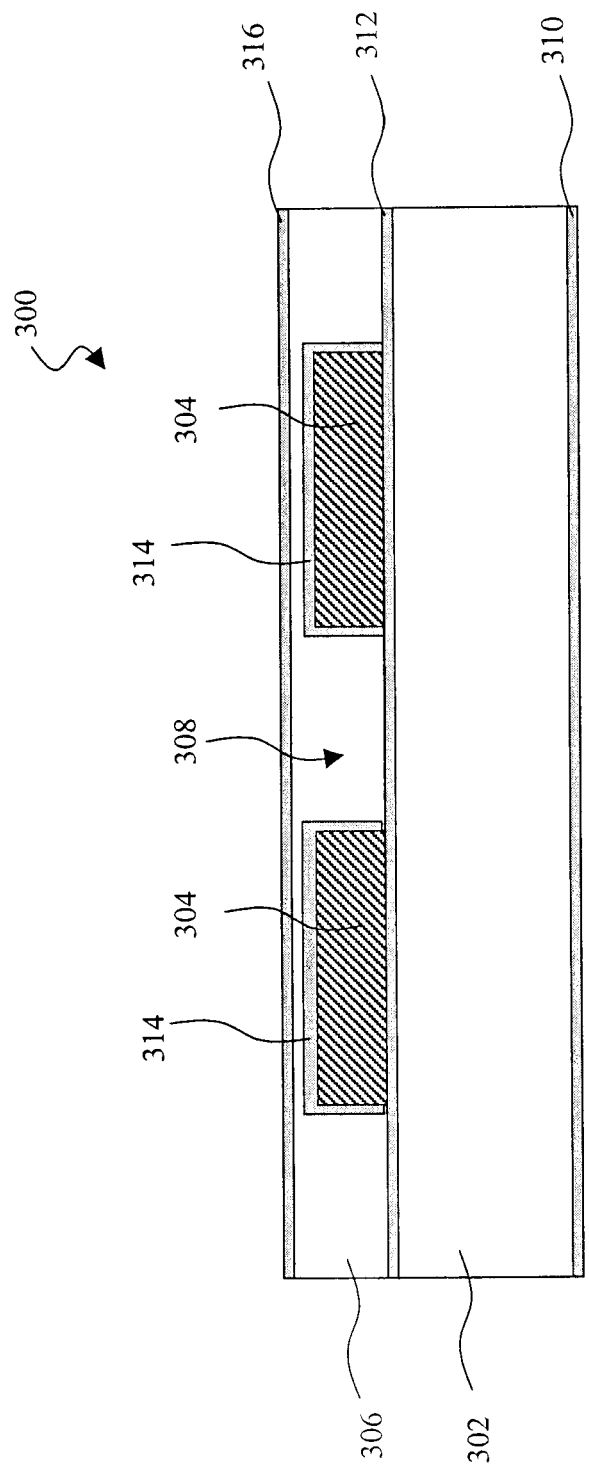
FIG. 7 illustrates a cross-sectional view of yet another embodiment of a photomask with a wavelength reducing medium.

Referring now to FIG. 7, a cross-sectional view of yet another embodiment of a photomask 300 is illustrated. The photomask 300 comprises a transparent substrate 302, an absorption layer 304, a WRM 306, and a plurality of antireflection coating (ARC) layers. As the transparent substrate 302, absorption layer 304, and WRM 306 are similar to those described previously, they will not be described in detail in the present example.

For purposes of illustration, the ARC layers may include an ARC layer 310 on an underside (relative to the absorption layer 304) of the substrate 302, an ARC layer 312 between the substrate 302 and the absorption layer 304, an ARC layer 314 between the absorption layer 304 and the WRM 306, and/or an ARC layer 316 above the WRM 306. These ARC layers are similar to those described with respect to FIG. 4, except that the ARC layer 214 covers the sidewalls of the absorption layer 304 (e.g., the walls of the openings 308).

Figure 8:
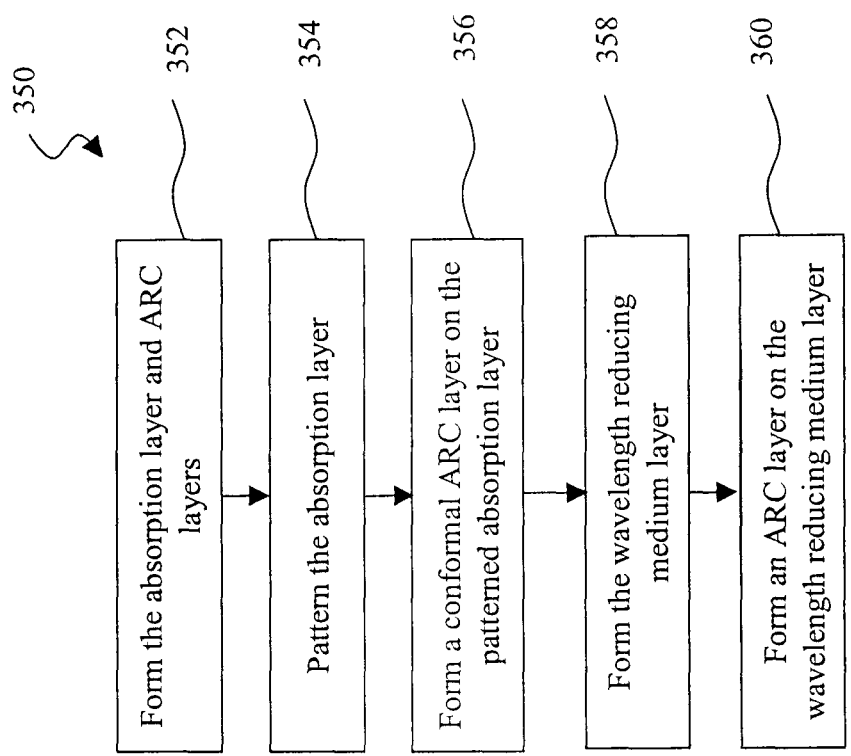
FIG. 8 is a flow chart of an exemplary method for forming the photomask of FIG. 7.
Figure 9A:
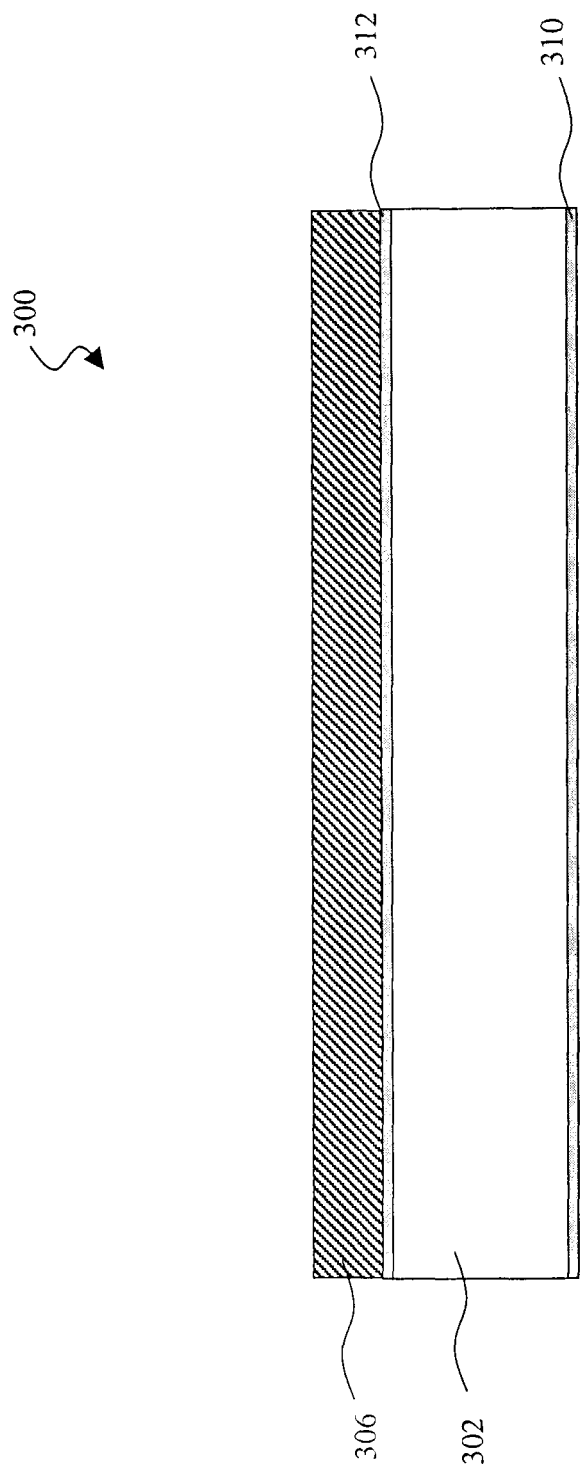
FIGS. 9a-9c illustrate various fabrication stages of the photomask of FIG. 7 as it is formed using the method of FIG. 8.
Figure 9B:
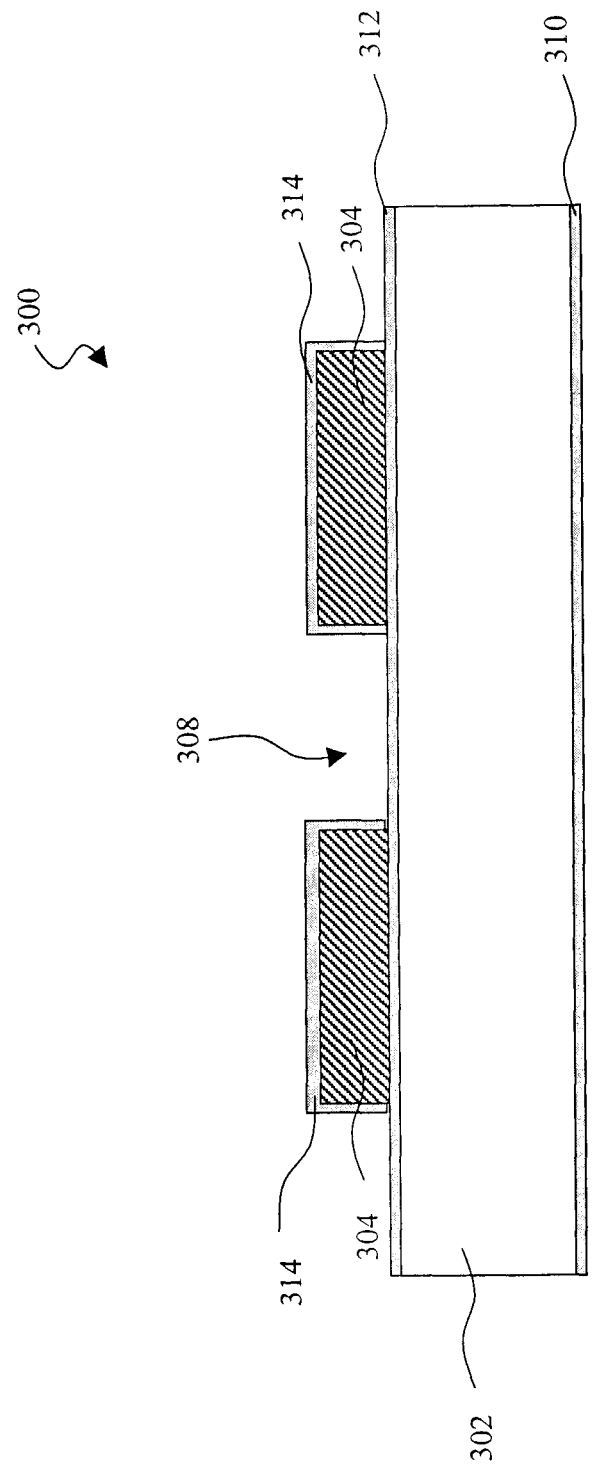
Figure 9C:
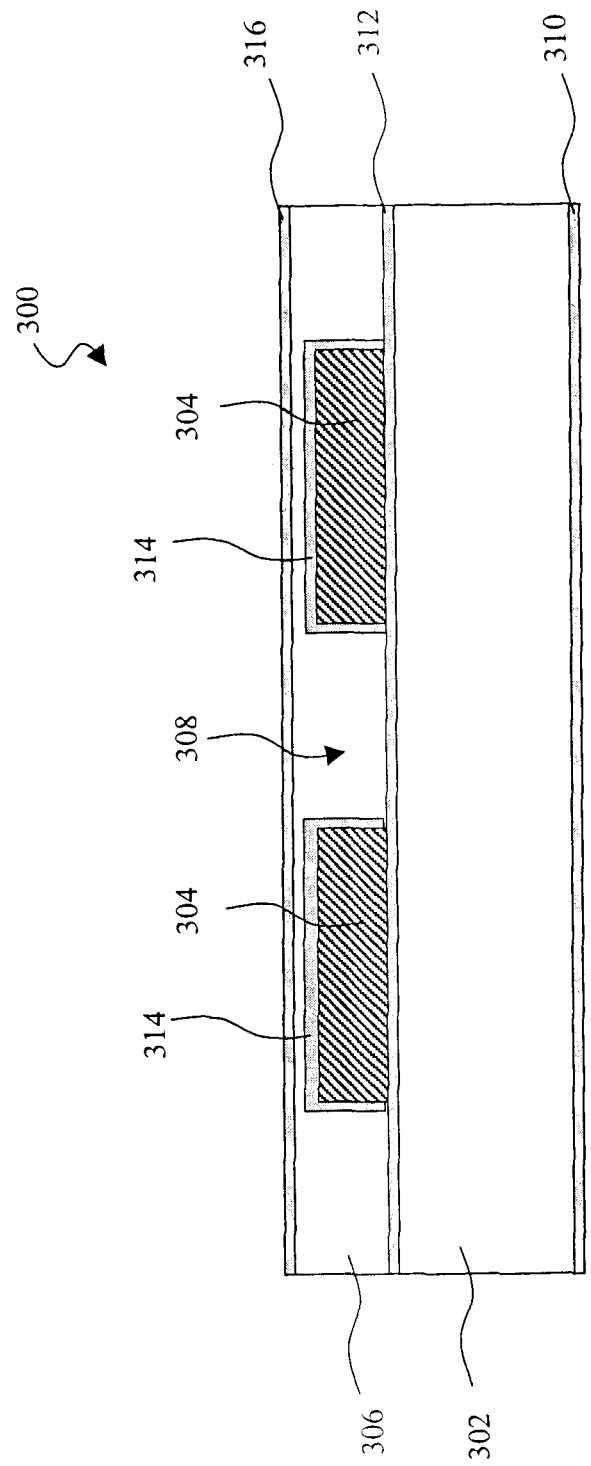

Referring now to FIG. 8 and with additional reference to FIGS. 9a-9c, an exemplary method 350 may be used to form the photomask 300 of FIG. 7. The method 350 begins in step 352 with the formation of the ARC layer 310 on the substrate 302, the formation of the ARC layer 312 on the other side of the substrate 302, and the formation of the absorption layer 304. Unlike the method 250 previously described, the ARC layer 314 is not formed during this step.

In step 354, the absorption layer 304 may be patterned to have a predefined arrangement of openings as previously described and, in step 356, the ARC layer 314 is formed. Since the ARC layer 314 is formed after the absorption layer 304 is formed and patterned, the ARC layer 314 conforms to the shape of the absorption layer 304. This enables the ARC layer 314 to be formed over the sidewalls of the absorption layer 304 (FIG. 8b). In step 358, the WRM 306 may be formed and, in step 360, the ARC layer 316 may be formed using similar materials and processing methods as those used in step 352.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. For example, one or more of the illustrated ARC layers may be excluded or additional ARC layers may be used. Materials used for the transparent substrate, absorption layer, wavelength reducing material, and ARC layers may vary, as may the method by which the various layers are formed. Accordingly, it is appropriate that the appended claims be construed broadly and in a manner consistent with the scope of the invention.

What is claimed is:

1. A photomask for forming a pattern during photolithography when illuminated with a predetermined wavelength of light, the photomask comprising:
   a transparent substrate;
   an absorption layer formed over the transparent substrate, wherein the absorption layer includes a first absorption feature and a second absorption feature, wherein an opening within the absorption layer extends from the first absorption feature to the second absorption feature;
   a layer of wavelength-reducing material disposed in the at least one opening, wherein the wavelength-reducing material and the absorption layer form a generally planar surface; and
   a first antireflection coating layer formed over the first absorption feature, the second absorption feature, and the wavelength-reducing material disposed in the opening, wherein the first antireflection coating layer has a planar top surface that extends over the first absorption feature to the second absorption feature including over the entire wavelength-reducing material disposed in the opening.

2. The photomask of claim 1 wherein a thickness of the wavelength-reducing material is substantially equal to a thickness of the absorption layer.

3. The photomask of claim 1 wherein the wavelength-reducing material forms a generally planar surface beyond the absorption layer.

4. The photomask of claim 1 wherein the wavelength-reducing material thickness is from about a thickness of the absorption layer to about ten times the predetermined wavelength of the light.

5. The photomask of claim 1 wherein the wavelength-reducing material comprises a transparent polymer material.

6. The photomask of claim 1 wherein the wavelength-reducing material comprises a photoresist material.

7. The photomask of claim 1 wherein the wavelength-reducing material comprises a transparent dielectric material.

8. The photomask of claim 1 wherein the absorption layer has a transmissivity of between about 3% and about 30% and is adapted to modify a phase of light passing through the absorption layer.

9. The photomask of claim 1 wherein the wavelength-reducing material has a refractive index different from that of the absorption layer.

10. The photomask of claim 1 further comprising a second antireflection coating layer on the first and second absorption features.

11. The photomask of claim 1 further comprising a second antireflection coating layer formed on a first side of the transparent substrate.

12. The photomask of claim 1 further comprising a second antireflection coating layer between the absorption layer and the wavelength-reducing material.

13. The photomask of claim 1 further comprising a second antireflection coating layer between the wavelength-reducing material and the transparent substrate.

14. The photomask of claim 1 further comprising a second antireflection coating layer between the absorption layer and the transparent substrate.

15. The photomask of claim 1 further comprising a second antireflection coating layer with a graded structure.

16. A photomask comprising:
   a substantially transparent substrate;
   an absorption layer formed over a surface of the substantially transparent substrate and defining an opening therein;
   a high refractive index layer disposed in the opening of the absorption layer and operable to reduce a wavelength of light passing therethrough during photolithography; and
   an antireflection coating layer formed directly over the opening, the antireflection coating layer having a planar surface spanning over the entire opening, the planar surface facing away from the substantially transparent substrate.

17. A photomask comprising:
   a transparent substrate;
   an absorption layer formed over the transparent substrate, wherein the absorption layer includes a first absorption feature and a second absorption feature, wherein an opening within the absorption layer extends from the first absorption feature to the second absorption feature;
   a layer of wavelength-reducing material disposed over the absorption layer including within the opening, wherein the wavelength-reducing material has a planar top surface that extends over the first absorption feature to the second absorption feature including over the opening; and
   a first antireflection coating layer formed over the wavelength-reducing material, wherein the first antireflection coating layer has a planar bottom surface that extends over the first absorption feature to the second absorption feature including over the entire wavelength-reducing material disposed in the opening.

18. The photomask of claim 17, wherein the entire planar bottom surface of the first antireflection coating layer physically contacts the entire planar top surface of the wavelength-reducing material as the first antireflection coating layer extends over the first absorption feature to the second absorption feature including over the wavelength-reducing material disposed in the opening.

19. The photomask of claim 17, further comprising a second antireflection coating layer formed directly on the first absorption feature, wherein the second antireflection coating layer physically contacts opposing sidewall surfaces of the first absorption feature.

20. The photomask of claim 17, wherein the wavelength-reducing material includes one of polyimide and polyvinyl alcohol.

21. The photomask of claim 17, wherein the transparent substrate has an upper surface and an opposing lower surface, the absorption layer being more proximate to the upper surface of the transparent substrate than to the lower surface of the transparent substrate, the photomask further comprising:
   a second antireflection coating layer formed on the lower surface of the transparent substrate;
   a third antireflection coating layer formed on the upper surface of the transparent substrate such that the third antireflection coating layer is positioned between the absorption layer and the upper surface of the transparent substrate; and
   a fourth antireflection coating layer formed on the absorption layer, wherein the fourth antireflection coating layer covers an upper surface and opposing sidewalls surfaces of the absorption layer.

\* \* \* \* \*